(12) United States Patent
Saito et al.

(10) Patent No.: US 6,805,968 B2
(45) Date of Patent: Oct. 19, 2004

(54) MEMBERS FOR SEMICONDUCTOR MANUFACTURING APPARATUS AND METHOD FOR PRODUCING THE SAME

(75) Inventors: Yukimasa Saito, Tokyo (JP); Hiroshi Sakurai, Tokyo (JP); Kazumi Tani, Hyogo (JP); Kiyoshi Miyajima, Hyogo (JP); Takema Teratani, Hyogo (JP); Tatsuya Hamaguchi, Yamanashi (JP)

(73) Assignee: Tocalo Co., Ltd., Hyogo (JP)

( * ) Notice: Subject to any disclaimer, the term of this patent is extended or adjusted under 35 U.S.C. 154(b) by 240 days.

(21) Appl. No.: 10/131,147

(22) Filed: Apr. 25, 2002

(65) Prior Publication Data

US 2002/0192480 A1 Dec. 19, 2002

(30) Foreign Application Priority Data

Apr. 26, 2001 (JP) ........................................ 2001-130262

(51) Int. Cl.[7] .................. B32B 15/04; B32B 15/18; B32B 33/00; B05D 5/00
(52) U.S. Cl. ..................... 428/469; 428/446; 428/472; 427/376.5; 427/205; 427/287
(58) Field of Search ............................ 428/469, 446, 428/472; 427/205, 287, 376.5

(56) References Cited

U.S. PATENT DOCUMENTS

| | | | | |
|---|---|---|---|---|
| 3,990,860 A | * | 11/1976 | Fletcher et al. ............. | 428/404 |
| 4,536,228 A | * | 8/1985 | Treharne .................... | 148/254 |
| 5,221,562 A | * | 6/1993 | Morgan ....................... | 427/555 |
| 5,294,485 A | * | 3/1994 | Takao et al. ................ | 428/626 |
| 5,468,557 A | * | 11/1995 | Nishio et al. ............... | 428/384 |
| 6,159,298 A | * | 12/2000 | Saito ........................... | 118/715 |
| 6,383,300 B1 | * | 5/2002 | Saito et al. ................. | 118/715 |
| 6,682,780 B2 | * | 1/2004 | Tzatzov et al. .......... | 427/383.1 |

FOREIGN PATENT DOCUMENTS

| | | |
|---|---|---|
| JP | 59-9171 | 1/1984 |
| JP | 61-52374 | 3/1986 |
| JP | 63-126682 | 5/1988 |
| JP | 63-317680 | 12/1988 |
| JP | 2000-77551 | 3/2000 |
| JP | 2000-332091 | 11/2000 |

OTHER PUBLICATIONS

English Language Abstract of JP 4–354327.
English Language Abstract of JP 2000–77551.
English Language Abstract of JP 2000–332091.
English Language Abstract of JP 59–9171.
English Language Abstract of JP 61–52374.
English Language Abstract of JP 63–126682.
English Language Abstract of JP 63–317680.

* cited by examiner

Primary Examiner—Deborah Jones
Assistant Examiner—Jason L Savage
(74) Attorney, Agent, or Firm—Greenblum & Bernstein, P.L.C.

(57) ABSTRACT

A member for a semiconductor manufacturing apparatus comprises a steel substrate and a composite oxide film formed on a surface thereof and comprised of silicon oxide-aluminum oxide-chromium oxide and a sintering aid.

10 Claims, 2 Drawing Sheets

MEMBERS FOR SEMICONDUCTOR MANUFACTURING APPARATUS AND METHOD FOR PRODUCING THE SAME

BACKGROUND OF THE INVENTION

1. Field of the Invention

This invention relates to a member used as a structural material for a semiconductor manufacturing apparatus such as a heat treating device or a diffusion treating device for a wafer, a CVD device or the like and a method for producing the same, and more particularly to a method for producing a member for a semiconductor manufacturing apparatus which is coated with a composite oxide film having excellent resistance to corrosion through a halogen compound or the like and resistance to metal release in a treatment under high vacuum.

2. Description of Related Art

Semiconductor elements are frequently manufactured by forming a film or the like for wiring or insulating layer onto a silicon wafer. As an apparatus for the manufacture of such semiconductors, there are an oxidation-diffusion device, a CVD device and so on. The oxidation-diffusion device is a device used for a treatment for the formation of an oxide film wherein steam ($H_2O$) or oxygen ($O_2$) made from a mixed gas of hydrogen ($H_2$) and oxygen ($O_2$) is introduced into a reaction vessel to form an oxide film onto a silicon wafer and for a treatment of diffusing an impurity such as phosphor (P), boron (B) or the like. And also, the CVD device is a device wherein several kinds of reactive gases are introduced into a treating furnace to form a desired film onto a silicon wafer through chemical reaction within a range of 300–1000° C. In these devices, an inorganic material such as quartz or a metal material is used as a member constituting the reaction vessel for treating the silicon wafer, but the use of the metal tends to be eliminated. However, it is difficult that all the materials are non-metal inorganic material, which become disadvantageous in the cost.

It is usual that a metal material such as stainless steel (SUS316L) or the like is used in a portion exposed to an atmosphere in the reaction vessel among the members constituting the reaction vessel and a chromium passive film is formed on a surface thereof. For example, as a technique of positively forming a chromium oxide onto a surface of a stainless steel substrate to improve a corrosion resistance, there is known a technique that the chromium (VI) oxide ($CrO_3$) is chemically changed to form a hard film of fine chromium (III) oxide ($Cr_2O_3$) in JP-A-59-9171, JP-A-61-52374, JP-A-63-126682 and JP-A-63-317680.

However, the passive films of the chromium oxide disclosed in the above publications are not necessarily sufficient in the corrosion resistance to substrate. Because, it has been elucidated that a substrate material component (SUS316L) for these members adheres to the silicon wafer in accordance with conditions of a film forming process such as treating temperature and the like, which results in a metal contamination. Particularly, it has been confirmed that the contamination through the substrate metal material increases when flowing a reducing gas such as hydrogen and ammonia and when flowing a corrosive gas of a chloride, or when cleaning is conducted with a halogen compound such as chlorine trifluoride or the like.

Now, the stainless steel is known as a metal material having an excellent corrosion resistance and a surface thereof forms a passive film of chromium oxide ($Cr_2O_3$) by contacting with an atmosphere. Such a passive film is naturally thin in the thickness and is easily broken by erosion due to collision with particles or contact with an acid solution or the like, but is peculiar to have a property of reproducing the passive film through a self repairing action.

However, a chemical reaction for the reproduction is required to kinetically take a long time. Particularly, a part of a member constituting the semiconductor manufacturing apparatus is placed under a condition of alternately exposing to an atmosphere, a reduced atmosphere of a low oxygen and a reactive gas in a short time, so that there is caused a problem that an effect is not obtained to an expected level.

SUMMARY OF THE INVENTION

It is, therefore, an object of the invention to propose a technique for obtaining a member for a semiconductor manufacturing apparatus having excellent corrosion resistance and resistance to metal contamination.

It is another object of the invention to provide a member coated with a composite oxide film having excellent corrosion resistance to various corrosive gases and halogen compounds and resistance to metal contamination in a treatment under a high vacuum.

The inventors have made various studies for achieving the above objects and found that when a surface of a metal material substrate is coated with a chemically stable composite oxide film, a release of a metal atom from the substrate can be controlled and also an effective corrosion resistance can be obtained under a strong corrosive environment, and as a result, the invention has been accomplished.

That is, the invention lies in a member for a semiconductor manufacturing apparatus comprising a steel substrate and a composite oxide film formed on a surface thereof and comprised of silicon oxide-aluminum oxide-chromium oxide and a sintering aid.

In preferable embodiments of the invention, (1) the composite oxide film is made of a chemical densified film consisting of silicon oxide, aluminum oxide and sintering aid and amorphous chromium oxide fine particles filled in a space of the film and coating the surface of the film;
(2) the composite oxide film is formed by applying and firing a slurry containing silicon oxide, aluminum oxide and sintering aid to form a chemical densified film, and applying an aqueous solution of chromic acid and sintering aid thereonto and firing at a temperature of 250–750° C. to precipitate amorphous inorganic composite fine particles consisting of chromium oxide and sintering aid in a space of the substrate and onto the surface of the substrate;
(3) the sintering aid is a material of at least one selected from borate compounds, silicate compounds and phosphate compounds producing amorphous inorganic substance through sintering.

Furthermore, the invention lies in a method of producing a member for a semiconductor manufacturing apparatus which comprises applying and firing a slurry containing silicon oxide, aluminum oxide and a sintering aid onto a surface of a stainless substrate to form a chemical densified film, and then applying or spraying an aqueous solution of chromic acid containing a sintering aid onto a surface of the chemical densified film or immersing in this aqueous solution and firing at 250–750° C. to form a composite oxide film consisting of silicon oxide-aluminum oxide-chromium oxide and sintering aid.

BRIEF DESCRIPTION OF THE DRAWINGS

The invention will be described with reference to the accompanying drawings, wherein.

DETAILED DESCRIPTION OF THE INVENTION

A member for a semiconductor manufacturing apparatus having a high corrosion resistance and an excellent resistance to metal release according to the invention, particularly a structure of a composite oxide film coating a surface of a steel substrate will be described in detail below.

Figure 1:
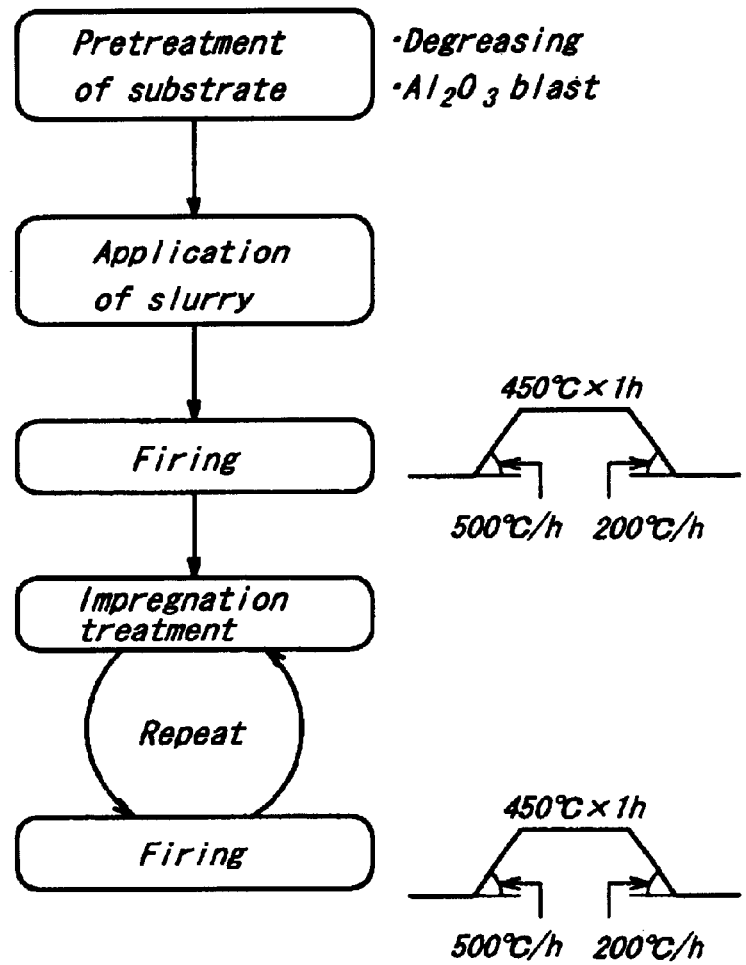
FIG. 1 is a flow chart for forming a composite oxide film on a surface of a steel substrate.

The invention is a member formed by coating a surface of stainless steel (SUS316L) as a substrate with a composite oxide film having a composition of silicon oxide ($SiO_2$)-aluminum oxide ($Al_2O_3$)-chromium oxide ($Cr_2O_3$) and a sintering aid, which is produced through steps as shown in FIG. 1.

That is, in the member for semiconductor manufacturing apparatus according to the invention, a slurry for primer containing $SiO_2$ and $Al_2O_3$ is first applied onto a surface of a stainless steel substrate subjected to a pretreatment such as degreasing and blast ($Al_2O_3$) treatment, and fired under conditions of heating to 450° C. at a temperature rising rate of 500° C./h and holding at this temperature for 1 hour and cooling at a temperature dropping rate of 200° C./h, whereby a chemical densified film is formed. Then, the chemical densified film is coated or sprayed with an aqueous mixed solution of a sintering aid containing solution and a chromic acid solution producing an amorphous inorganic substance through a firing treatment or immersed into such an aqueous mixed solution and thereafter fired under the same firing conditions as mentioned above to form a composite oxide film applicable to the invention.

As an example of the sintering aid containing solution producing the amorphous inorganic substance through the firing, there are aqueous solutions containing a borate compound, a silicate compound and a phosphate compound, which can form borate glass, silicate glass, phosphate glass and so on through the firing.

And also, the coating or immersion and firing of the aqueous mixed solution are favorable to be repeated plural times.

According to the inventors' experiment, as an example of preferable firing conditions, when a mixture of an aqueous solution of chromic acid-borate compound and an aqueous solution of chromic acid is applied, a heating temperature is 550–750° C., and when a mixture of chromic acid aqueous solution and phosphate compound aqueous solution is applied, a heating temperature is 250–550° C., and the heating is carried out at such a temperature for 0.5–2 hours. In this way, water contained in the aqueous solution is evaporated, while fine particles of chromium oxide are produced as a heating residue. It has been confirmed that such fine particles of chromium oxide are precipitated and filled (impregnated) in pores of the chemical densified film as a primer layer, i.e. chemical densified film of fired $SiO_2$—$Al_2O_3$ and sintering aid or gaps such as cracks or the like and also formed so as to cover the surface of the chemical densified film. That is, chromic acid renders into $Cr_2O_3$ (chromium oxide) through an intermediate and at the same time the aqueous solutions of borate compound, silicate compound and phosphate compound render into amorphous inorganic substance while releasing water, respectively.

The composite oxide film consisting of the chemical densified film produced from the above aqueous solutions and a layer of amorphous chromic acid fine particles is constructed with $SiO_2$—$Al_2O_3$—$Cr_2O_3$ based oxide material as a whole, so that it is very hard and excellent in the abrasion resistance. And also, it contains at least one of phosphate compound, borate compound and silicate compound as a sintering aid. They are amorphous and at least a part of which indicates vitreous property and precipitate and invade (impregnate) into pores of the chemical densified film and gaps of cracks and the like and seal these spaces at a filled state.

The thickness of the composite oxide film is favorable to be about 40–120 μm.

Moreover, the sintering aid has a function of improving the adhesion property between the particles constituting the film. That is, it is considered that the amorphous substance produced by firing the borate compound, silicate compound and phosphate compound strengthens the bonding between $Cr_2O_3$ fine particles precipitated from the chromic acid containing slurry and the chemical densified film by sealing the cracks of the chemical densified film. Moreover, these components are large in the affinity with oxygen and thermodynamically stable at a temperature region from room temperature to 750° C.

And also, the composite oxide film is formed by heating and firing from the starting materials at the above various slurries and aqueous solution state, so that the surface thereof is smooth and small in the specific surface area and further small in the porosity and hence the dense film structure can be formed.

The member coated with the composite oxide film for the semiconductor manufacturing apparatus such as oxidation-diffusion device, CVD device or the like is frequently washed with an aqueous solution of hydrofluoric acid in the maintenance of the apparatus. In this case, the invasion of the aqueous solution of hydrofluoric acid or the like for washing into the composite oxide film can be prevented because the coating of the composite oxide film is excellent in the chemical stability to hydrofluoric acid and the environment shielding property.

Table 1 shows conditions according to the invention when the composite oxide film is formed on the surface of the steel substrate.

TABLE 1

| | Composite oxide film | |
| --- | --- | --- |
| | Main components | Firing |
| Slurry | $SiO_2$ /$Al_2O_3$ particle slurry + $CrO_3$ aqueous solution | conducted |
| Impregnating agent | $CrO_3$ aqueous solution $CrO_3$ aqueous solution + aqueous solution of borate compound, silicate compound or phosphate compound | conducted |

Figure 2:
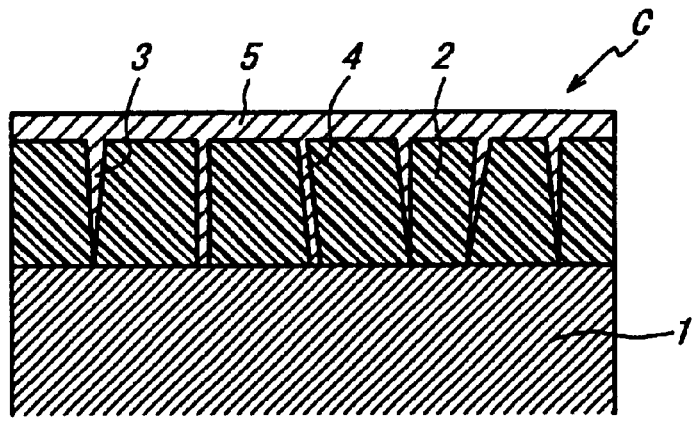
FIG. 2 is a diagrammatically partial section view of a member formed by coating a composite oxide film on a surface of a steel substrate.

Furthermore, FIG. 2 shows an example of a section structure of a portion coated with the composite oxide film according to the invention. In FIG. 2, symbol c is a composite oxide film, and numeral 1 is a stainless steel substrate, numeral 2 a chemical densified film, numeral 3 composite fine particles of chromium oxide-amorphous sintering aid inorganic substance filled in pores and cracks of the composite oxide film c, and numeral 4 and 5 layers of composite fine particles of chromium oxide-amorphous sintering aid inorganic substance coating the surface of the composite oxide film.

As seen from the above section structure, the layer of the composite fine particles of the chromium oxide-amorphous inorganic substance has a very high environment shielding property because these fine particles are completely filled in the cracks of the composite oxide film.

EXAMPLE 1

In this example, a silicon wafer is subjected to a heat treatment by using a semiconductor manufacturing apparatus (CVD device) constructed with such a portion of a member contacting with a gas that is coated with a composite oxide film according to the invention to measure a metal contamination influenced on the silicon wafer.

(1) Composite oxide film according to the invention: A slurry containing silicon oxide-aluminum oxide and phosphoric acid is applied onto an inner face of a substrate (SUS316L: a tubular material of outer diameter 300.0 mm×thickness 0.9 mm) and heated and fired to form a chemical densified film, and therefter the chemical densified film is immersed in an aqueous solution mainly composed of chromic acid and phosphoric acid and taken out therefrom and subjected to a heat treatment at 450° C. for 1 hour, such a treatment is repeated 6 times to form a composite oxide film (80 μm).

(2) As a material of a comparative example is used a non-treated SUS316L steel substrate.

Figure 3:
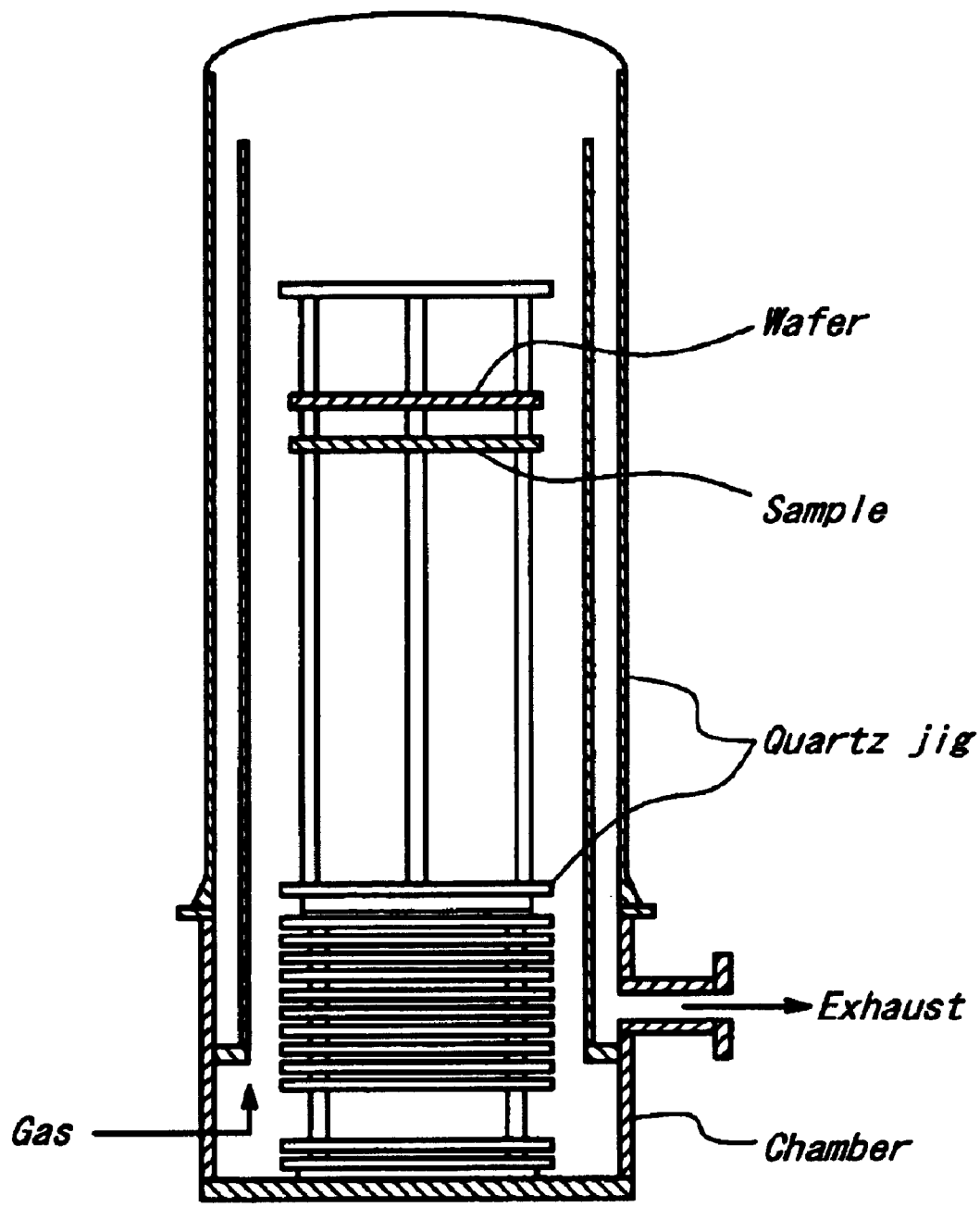
FIG. 3 is a schematic view of a testing vessel evaluating a metal contamination quantity.

Test results for evaluation of metal contamination quantity: A metal contamination quantity on the silicon wafer is measured by the test using an apparatus shown in FIG. 3. The results are shown in Table 2. As seen from Table 2, the metal contamination quantity on the silicon wafer using the non-treated SUS316L steel substrate in the comparative example is Fe: $3.9\times10^{12}$ atm/cm$^2$ and Cu: $3.1\times10^{12}$ atm/cm$^2$. On the contrary, the metal contamination quantity in the substrate coated with the composite oxide film according to the invention is reduced to Fe: $3.1\times10^{9}$ atm/cm$^2$ and Cu: $7.8\times10^{9}$ atm/cm$^2$.

TABLE 2

|  |  | Metal transfer quantity onto silicon wafer atoms/cm$^2$ | |
| --- | --- | --- | --- |
|  |  | Fe | Cu |
| Invention | SUS316L substrate coated with composite oxide film | $3.1 \times 10^9$ | $7.8 \times 10^9$ |
| Comparative Example | non-treated SUS316L substrate | $3.9 \times 10^{12}$ | $3.1 \times 10^{12}$ |
|  | Detection limit | $8 \times 10^8$ | $8 \times 10^8$ |

EXAMPLE 2

In this example, assuming that the substrate coated with the composite oxide film according to the invention is washed with an aqueous acid solution, the substrate is immersed in 10% hydrochloric acid for 24 hours, whereby a corrosion resistance to the aqueous acid solution is tested from a change of mass before and after the immersion. Moreover, the non-treated SUS316L steel substrate as a comparative example is conspicuous in the mass loss due to dissolution, so that the immersing time is 1 hour. The test results are shown in Table 3. As seen from Table 3, the mass change in the member coated with the composite oxide film according to the invention is equal to that of a quartz material and indicates an excellent corrosion resistance.

TABLE 3

| Specimen | | Changing ratio of mass after immersion in 10% hydrochloric acid (%) |
| --- | --- | --- |
| Invention | member coated with composite oxide film | 0.006 |
| Comparative 1 | non-treated SUS316L | 0.15 |
| Example 2 | substrate quartz | 0.001 |

As mentioned above, according to the invention, when the member coated with the composite oxide film peculiar to the invention is used as a structural member for a semiconductor manufacturing apparatus, a metal releasing quantity from the surface of the member is considerably reduced and the metal contamination to the silicon wafer can be apparently decreased. And also, the member for the apparatus can be washed with the aqueous acid solution, whereby the property of maintaining the cleanness of the apparatus can be improved. Furthermore, the member usually made from quartz material can be replaced with the member coated with the composite oxide film according to the invention, so that it is possible to decrease the cost and also the operation and maintenance become easy and it is expected to widen the application range of the invention to the member for the semiconductor manufacturing apparatus.

What is claimed is:

1. A member for a semiconductor manufacturing apparatus comprising a steel substrate and a composite oxide film formed on a surface thereof and comprised of silicon oxide-aluminum oxide-chromium oxide and a sintering aid.

2. A member for a semiconductor manufacturing apparatus according to claim 1, wherein the composite oxide film is made of a chemically densified film composed of silicon oxide, aluminum oxide and its sintering aid and a layer of amorphous chromium oxide fine particles filled in a space of the film and coating the surface of the film.

3. A member for a semiconductor manufacturing apparatus according to claim 2, wherein the composite oxide film is formed by applying and firing a slurry containing silicon oxide, aluminum oxide and sintering aid to form a chemically densified film, and applying an aqueous solution of chromic acid and sintering aid thereonto and firing at a temperature of 250–750° C. to precipitate amorphous inorganic composite fine particles composed of chromium oxide and sintering aid in a space of the substrate and onto the surface of the substrate.

4. A member for a semiconductor manufacturing apparatus according to claim 3, wherein the sintering aid is a material of at least one selected from borate compounds, silicate compounds and phosphate compounds producing amorphous inorganic substance through sintering.

5. A member for a semiconductor manufacturing apparatus according to claim 2, wherein the sintering aid is a material of at least one selected from borate compounds, silicate compounds and phosphate compounds producing amorphous inorganic substance through sintering.

6. A member for a semiconductor manufacturing apparatus according to claim 1, wherein the composite oxide film is formed by applying and firing a slurry containing silicon oxide, aluminum oxide and sintering aid to form a chemically densified film, and applying an aqueous solution of chromic acid and sintering aid thereonto and firing at a temperature of 250–750° C. to precipitate amorphous inorganic composite fine particles composed of chromium oxide and sintering aid in a space of the substrate and onto the surface of the substrate.

7. A member for a semiconductor manufacturing apparatus according to claim 6, wherein the sintering aid is a material of at least one selected from borate compounds, silicate compounds and phosphate compounds producing amorphous inorganic substance through sintering.

8. A member for a semiconductor manufacturing apparatus according to claim 1, wherein the sintering aid is a material of at least one selected from borate compounds, silicate compounds and phosphate compounds producing amorphous inorganic substance through sintering.

9. A method of producing a member for a semiconductor manufacturing apparatus which comprises applying and firing a slurry containing silicon oxide, aluminum oxide and a sintering aid onto a surface of a steel substrate to form a chemically densified film, and then applying or spraying an aqueous solution of chromic acid containing a sintering aid onto a surface of the chemically densified film or immersing in this aqueous solution and firing at 250–750° C. to form a composite oxide film composed of silicon oxide-aluminum oxide-chromium oxide and sintering aid.

10. The method according to claim 9, wherein the sintering aid is a material of at least one selected from borate compounds, silicate compounds and phosphate compounds producing amorphous inorganic substance through sintering.

* * * * *

UNITED STATES PATENT AND TRADEMARK OFFICE
CERTIFICATE OF CORRECTION

PATENT NO. : 6,805,968 B2
DATED : October 19, 2004
INVENTOR(S) : Y. Saito et al.

It is certified that error appears in the above-identified patent and that said Letters Patent is hereby corrected as shown below:

Title page,
Item [56], References Cited, FOREIGN PATENT DOCUMENTS, include
-- 4-354327   12/08/92   Japan --

Signed and Sealed this

Seventh Day of June, 2005

JON W. DUDAS
*Director of the United States Patent and Trademark Office*